(12) United States Patent
Huang et al.

(10) Patent No.: US 6,746,205 B2
(45) Date of Patent: Jun. 8, 2004

(54) FAN FRAME

(75) Inventors: Wen-Shi Huang, Taoyuan (TW);
Kuo-Cheng Lin, Taoyuan (TW);
Shun-Chen Chang, Taoyuan (TW);
Wen-Hao Liu, Taoyuan (TW)

(73) Assignee: Delta Electronics, Inc. (TW)

( * ) Notice: Subject to any disclaimer, the term of this patent is extended or adjusted under 35 U.S.C. 154(b) by 0 days.

(21) Appl. No.: 10/236,547

(22) Filed: Sep. 4, 2002

(65) Prior Publication Data

US 2003/0219339 A1 Nov. 27, 2003

(30) Foreign Application Priority Data

May 22, 2002 (TW) ........................................ 91207350 U

(51) Int. Cl.[7] .............................................. F04D 29/54
(52) U.S. Cl. ........................ 415/116; 415/175; 415/220
(58) Field of Search ............................. 415/214.1, 221, 415/175, 116, 220; 416/247 R; 361/695

(56) References Cited

U.S. PATENT DOCUMENTS

| | | | | |
|---|---|---|---|---|
| 4,776,755 A | * | 10/1988 | Bjorkestam et al. | ..... 415/121.2 |
| 5,407,324 A | * | 4/1995 | Starnes et al. | ........... 415/208.5 |
| 6,015,265 A | * | 1/2000 | Lasko et al. | ............. 416/247 R |
| 6,017,191 A | * | 1/2000 | Harmsen | ................ 416/247 R |
| 6,332,755 B1 | * | 12/2001 | Fujinaka et al. | ......... 415/208.5 |

* cited by examiner

Primary Examiner—Ninh H. Nguyen
(74) Attorney, Agent, or Firm—Fulbright & Jaworski LLP

(57) ABSTRACT

A fan frame for use with a fan is provided, which includes: a frame body having a top side and a bottom side opposed to the top side; an opening formed through the top and bottom sides of the frame body, allowing a plurality of blades of the fan to be received in the opening; and at least a recessed portion formed on the frame body at a position outside the opening and connected to the opening. By rotation of the blades of the fan, air is adapted to enter via the top side of the frame body into the opening directly and also through the recessed portion into the opening, so as to facilitate air intake and wind output for the fan as well as to improve heat dissipation efficiency as the fan is mounted to an electronic device.

19 Claims, 13 Drawing Sheets

FAN FRAME

FIELD OF THE INVENTION

The present invention relates to fan frames, and more particularly, to a fan frame for use with a fan mounted in an electronic device so as to increase area for air intake and thus to enhance wind output from the fan.

BACKGROUND OF THE INVENTION

It is increasingly in demand for a highly-efficient heat dissipating fan for use in an electronic device such as power supplier or computer with enhanced power output and operating frequency. In order to improve heat dissipation efficiency, it is conventionally to increase rotation speed and modify blade feature for the heat dissipating fan so as to raise wind output from the fan.

As shown in FIG. 1A, a conventional heat dissipating fan 1 includes a square-shaped frame 2, with a plurality of blades 6 and coils, magnets and shaft bearings (not shown) being mounted in a centrally-situated opening 4 of the frame 2, and the fan 1 is fixed in position to an electronic device (not shown) by means of screws inserted through screw holes 8.

As shown in FIG. 1B, by rotation of the blades 6, air can enter from a top side of the frame 2 (as indicated by downward arrows in the drawing) through the opening 4 into the fan 2, so as to generate wind outputted via a bottom side of the frame 2. Therefore, air intake area of the fan 1 is equal to cross-sectional area of the opening 4, which is only slightly larger than area encompassed by outer circumference of the blades 6.

FIG. 2 illustrates another conventional heat dissipating fan 10, which is structurally similar to the above fan 1 shown in FIG. 1A, except that blades 16 of this fan 10 are arranged in larger gradient and have larger surface area so as to facilitate wind output. Nevertheless, air intake area of the fan 10 remains the same as equal to cross-sectional area of a centrally-situated opening 14 of a frame 12, which is only slightly larger than area encompassed by outer circumference of the blades 16.

With fixed air intake area provided by the opening 4, 14 of the frame 2, 12, modification in blade feature as described above or increase in rotation speed of the blades 6, 16 can hardly attain to effective or optimal improvement in air intake or wind output for the fan 1, 10.

Therefore, the problem to be solved herein is to provide a fan frame for use with a heat dissipating fan so as to increase air intake area for facilitating wind output and heat dissipation efficiency.

SUMMARY OF THE INVENTION

A primary objective of the present invention is to provide a fan frame, which can increase air intake area and wind output for a fan mounted with the fan frame.

In accordance with the above and other objectives, the present invention proposes a fan frame for use with a fan, comprising: a frame body having a top side and a bottom side opposed to the top side; an opening formed through the top and bottom sides of the frame body, allowing a plurality of blades of the fan to be received in the opening; and at least a recessed portion formed on the frame body at a position outside the opening and connected to the opening.

By rotation of the blades of the fan, air is adapted to enter via the top side of the frame body into the opening directly and also through the recessed portion into the opening, so as to facilitate air intake and wind output for the fan as well as to improve heat dissipation efficiency as the fan is mounted to an electronic device.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

First Preferred Embodiment

Figure 1A:
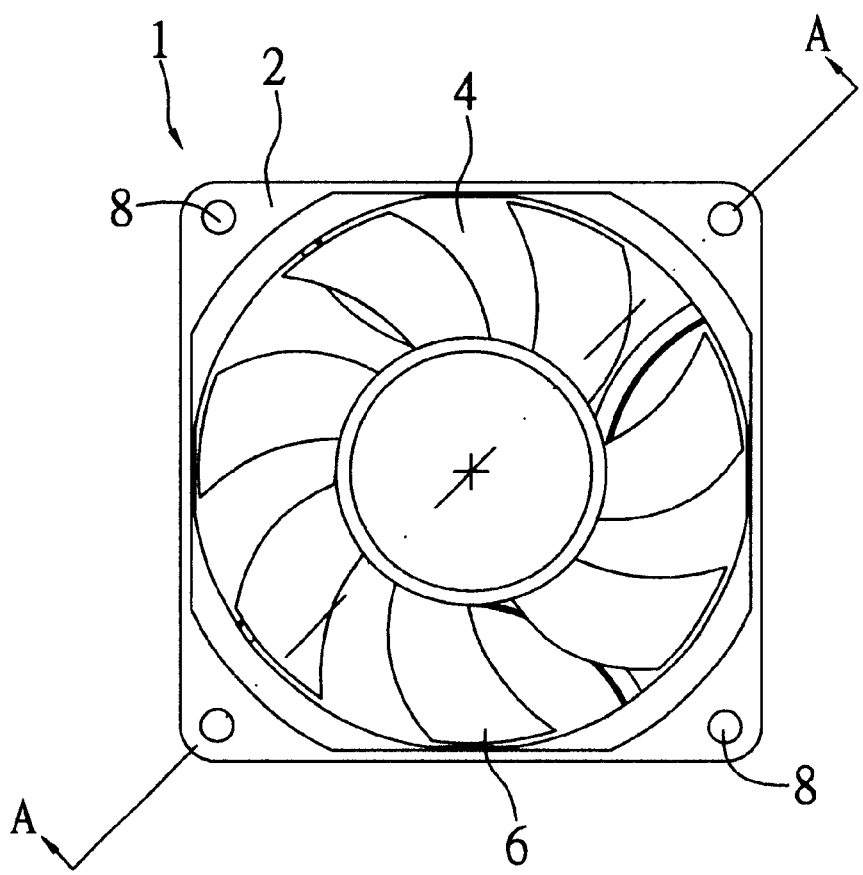
FIG. 1A (PRIOR ART) is a top view of a conventional fan.
Figure 1B:
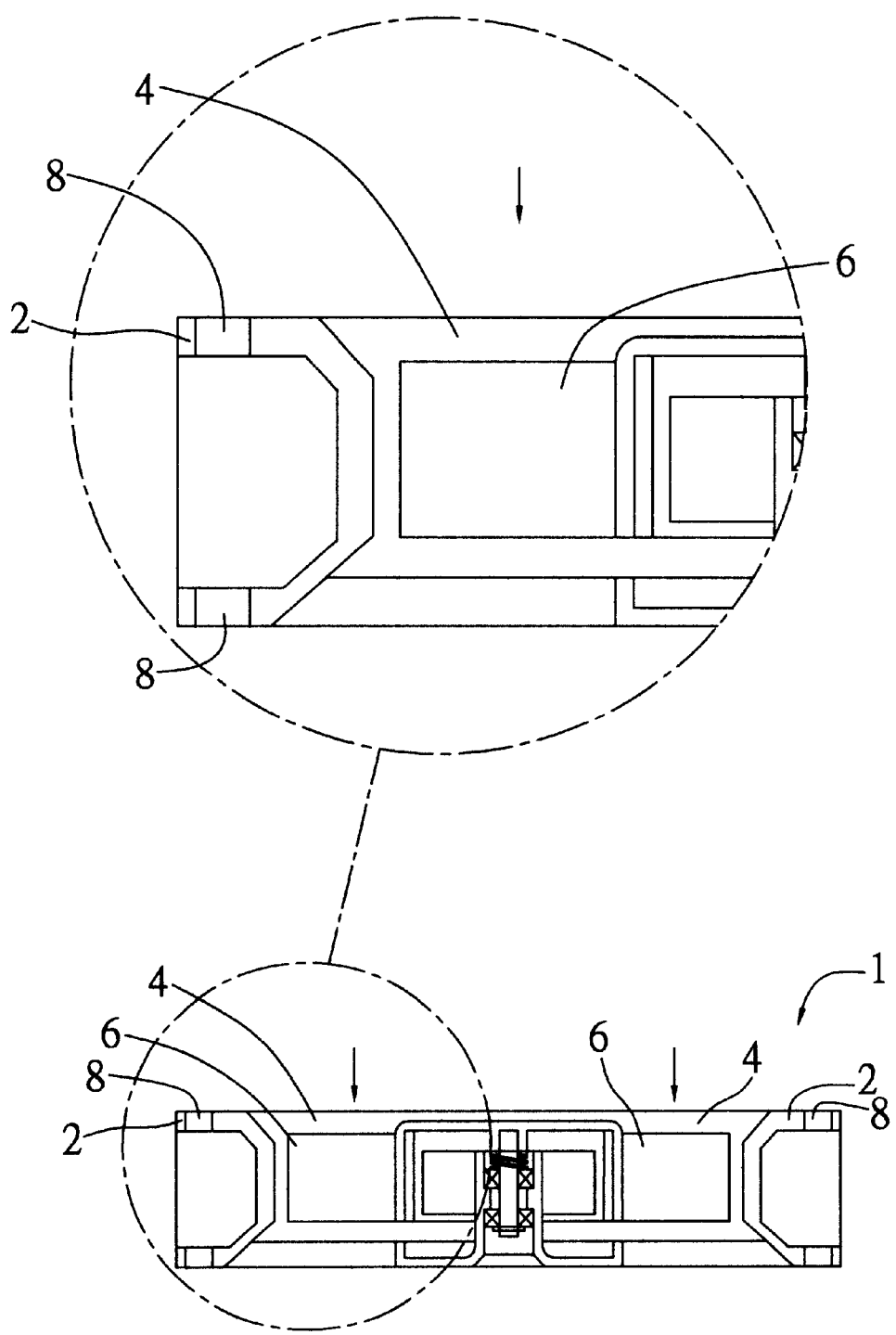
FIG. 1B (PRIOR ART) is a cross-sectional view and a partial enlarged view of the conventional fan shown in FIG. 1A taken along line A—A.
Figure 2:
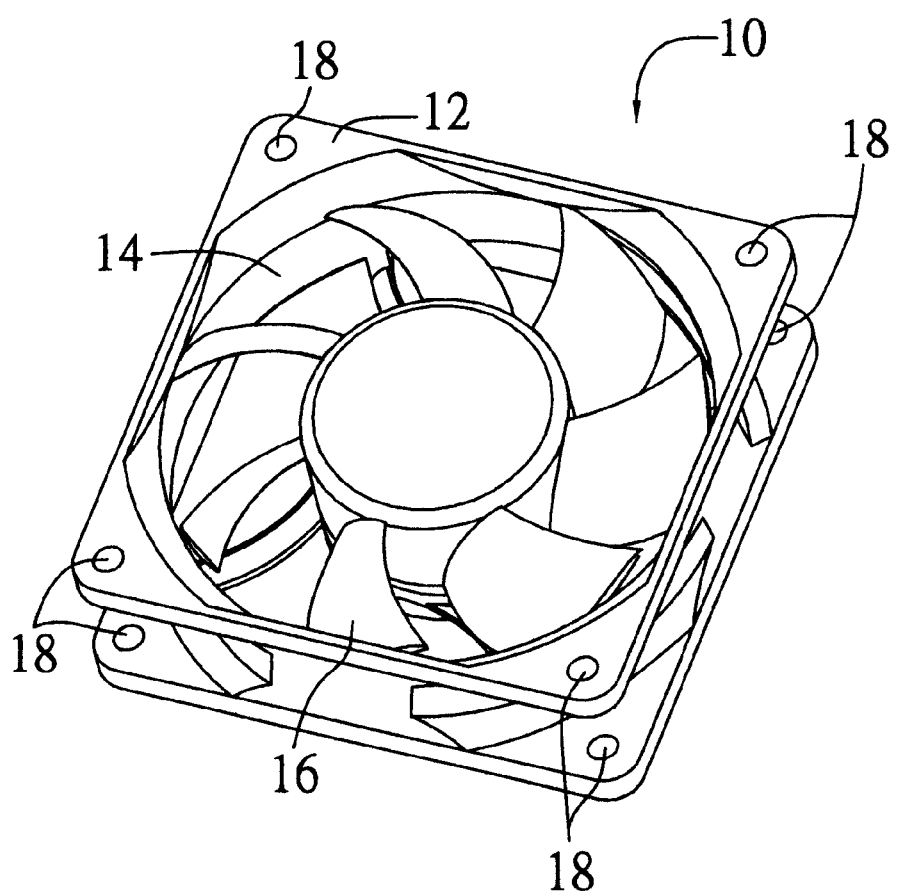
FIG. 2 (PRIOR ART) is a perspective view of another conventional fan.
Figure 3A:
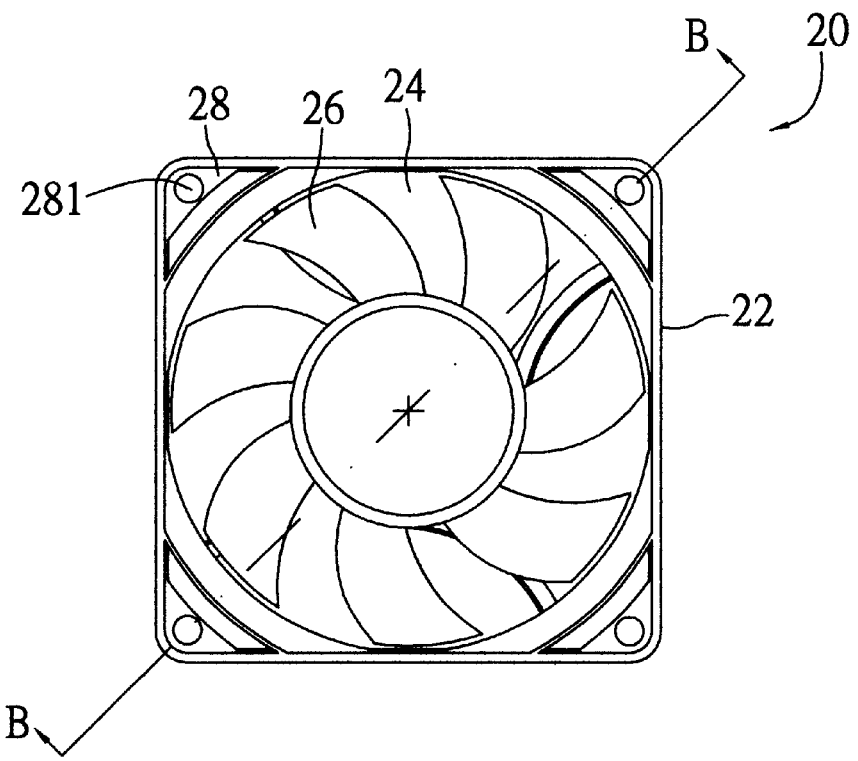
FIG. 3A is a top view of a fan with a fan frame according to a first preferred embodiment of the invention.
Figure 3B:
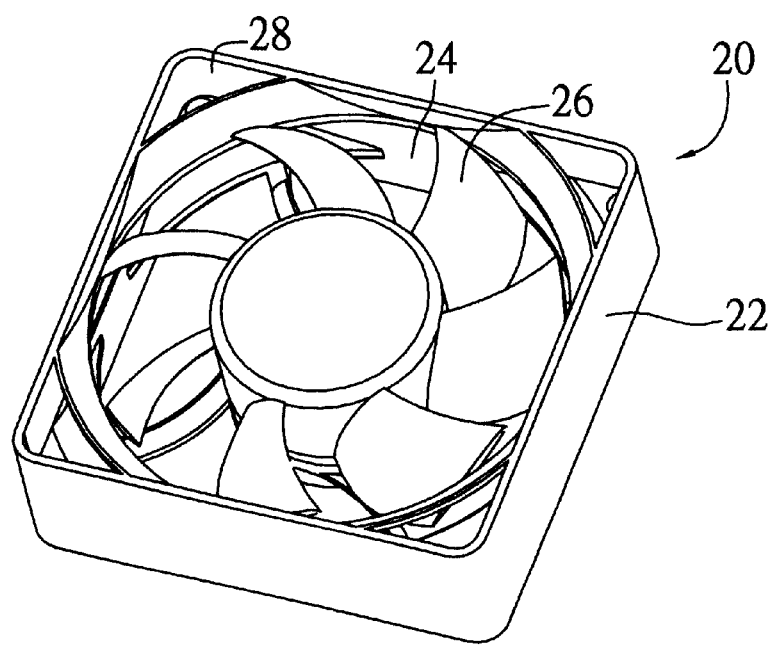
FIG. 3B is a perspective view of the fan shown in FIG. 3A.
Figure 3C:
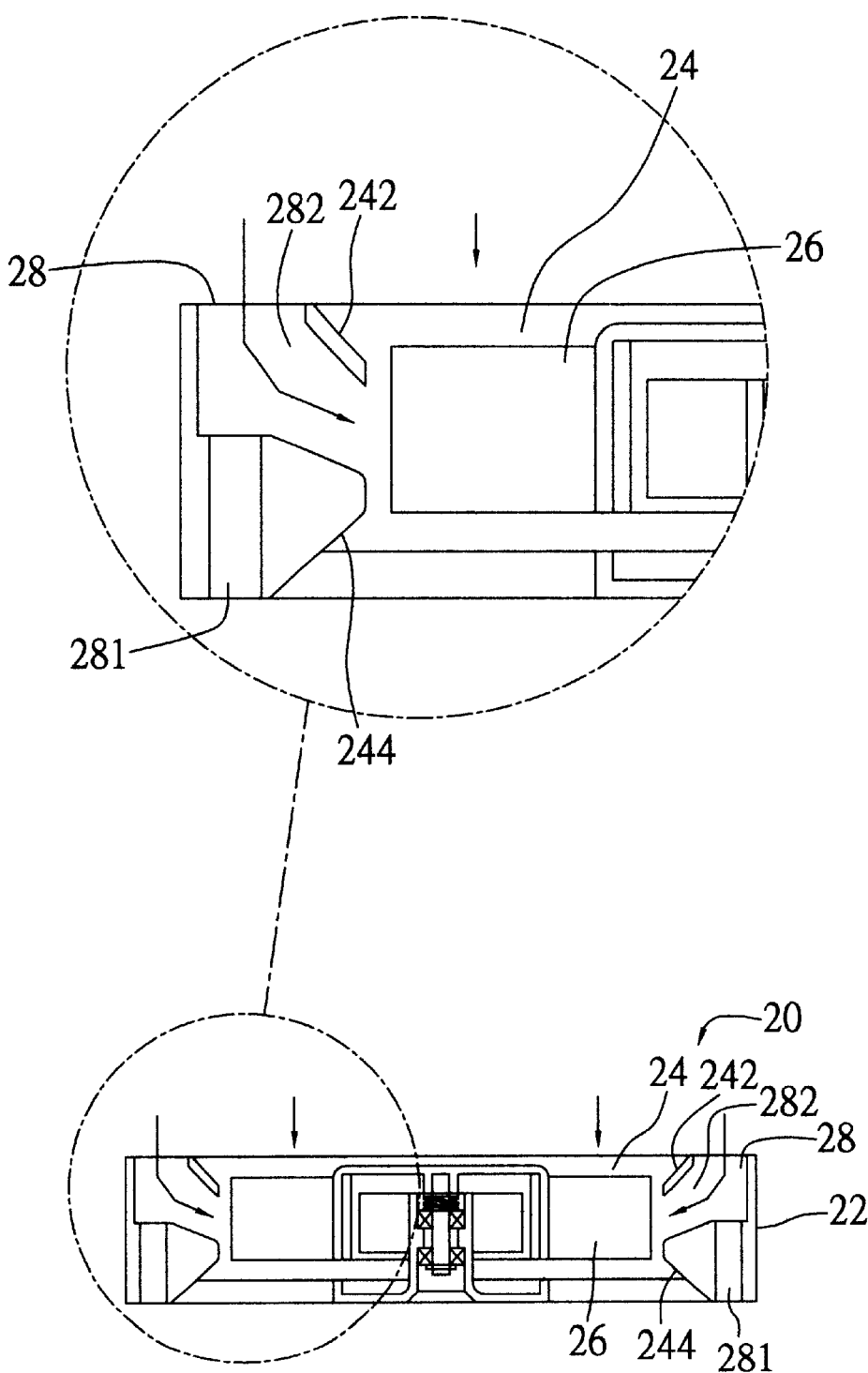
FIG. 3C is a cross-sectional view and a partial enlarged view of the fan shown in FIG. 3A taken along line B—B.

FIGS. 3A–3C illustrate a fan 20 with a fan frame 22 according to a first preferred embodiment of the invention. The fan 20 can be of any conventional fan structure having blades, coils, magnets and shaft bearings, such that no further description thereto is to be detailed herein.

As shown in FIGS. 3A and 3B, the fan frame 22 may be a square-shaped frame with a centrally-situated opening 24 for receiving a plurality of blades 26 and a driver unit (not shown) for driving rotation of the blades 26 therein. As shown in FIG. 3C, by rotation of the blades 26, air can enter from a top side of the fan frame 22 (as indicated by vertically downward arrows in the drawing) through the opening 24 into the fan 20, allowing wind to be generated and outputted via a bottom side of the fan frame 22, wherein the opening 24 are shaped with upper and lower inwardly-tapered conical surfaces 242, 244 respectively at positions corresponding to the top and bottom sides of the fan frame 22, so as to facilitate air intake and wind output for the fan 20.

Further referring to FIGS. 3A–3C, a recessed portion 28 is formed at each corner of the fan frame 22 at a position outside the opening 24, and recessed from the top side of the fan frame 22. The recessed portion 28 is provided at its bottom with at least a screw hole 281 where a screw can be inserted for fixing the fan 20 in position, and connected to the opening 24 via an auxiliary inlet 282 substantially vertical to the recessed portion 28. When the blades 26 rotate, air may enter not only through the opening 24 but also through the recessed portion 28 and auxiliary inlets 282 into the fan 20.

Therefore, total air intake area of the fan 20 includes cross-sectional area of the opening 24 and recessed portions 28, such that air intake can be effectively increased through the use of the fan frame 22, and thereby wind output and heat dissipation efficiency are enhanced, wherein increase in wind output is experimentally determined to be around 10% to 15%.

It should be understood that, the fan frame 22 is not limited to the square shape, but other shapes such as circle, ellipse or rhombus can be adopted; the opening 24 is not limited to be centrally situated with respect to the fan frame 22; and the recessed portions 28 may be formed at other peripheral positions outside the opening 24, instead of limited to corners of the fan frame 22.

Second Preferred Embodiment

Figure 4A:
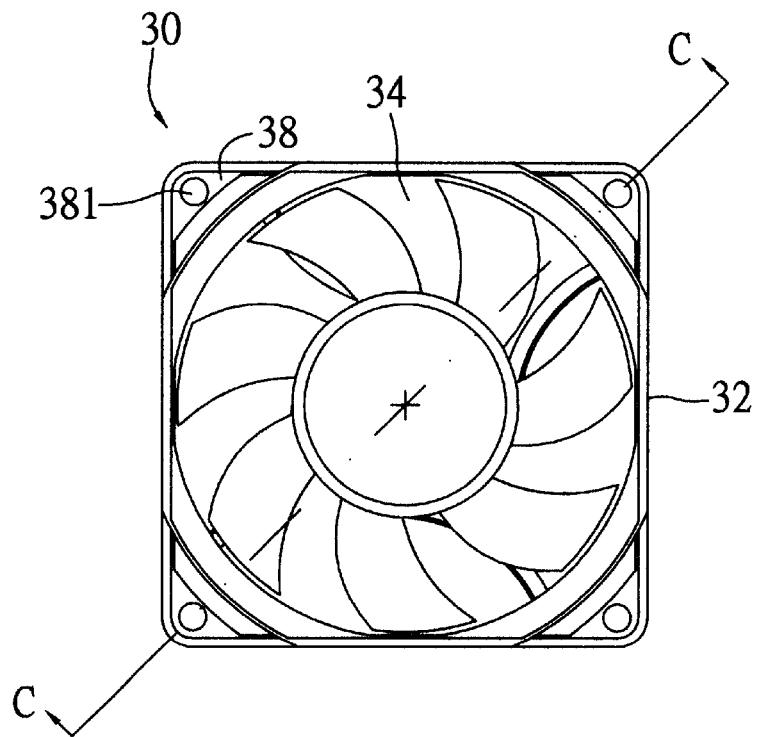
FIG. 4A is a top view of a fan with a fan frame according to a second preferred embodiment of the invention.
Figure 4B:
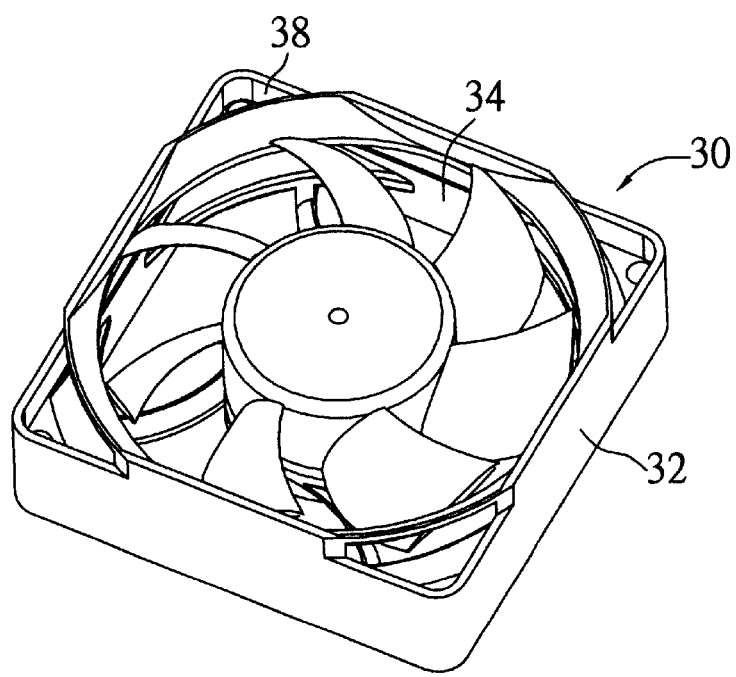
FIG. 4B is a perspective view of the fan shown in FIG. 4A.
Figure 4C:
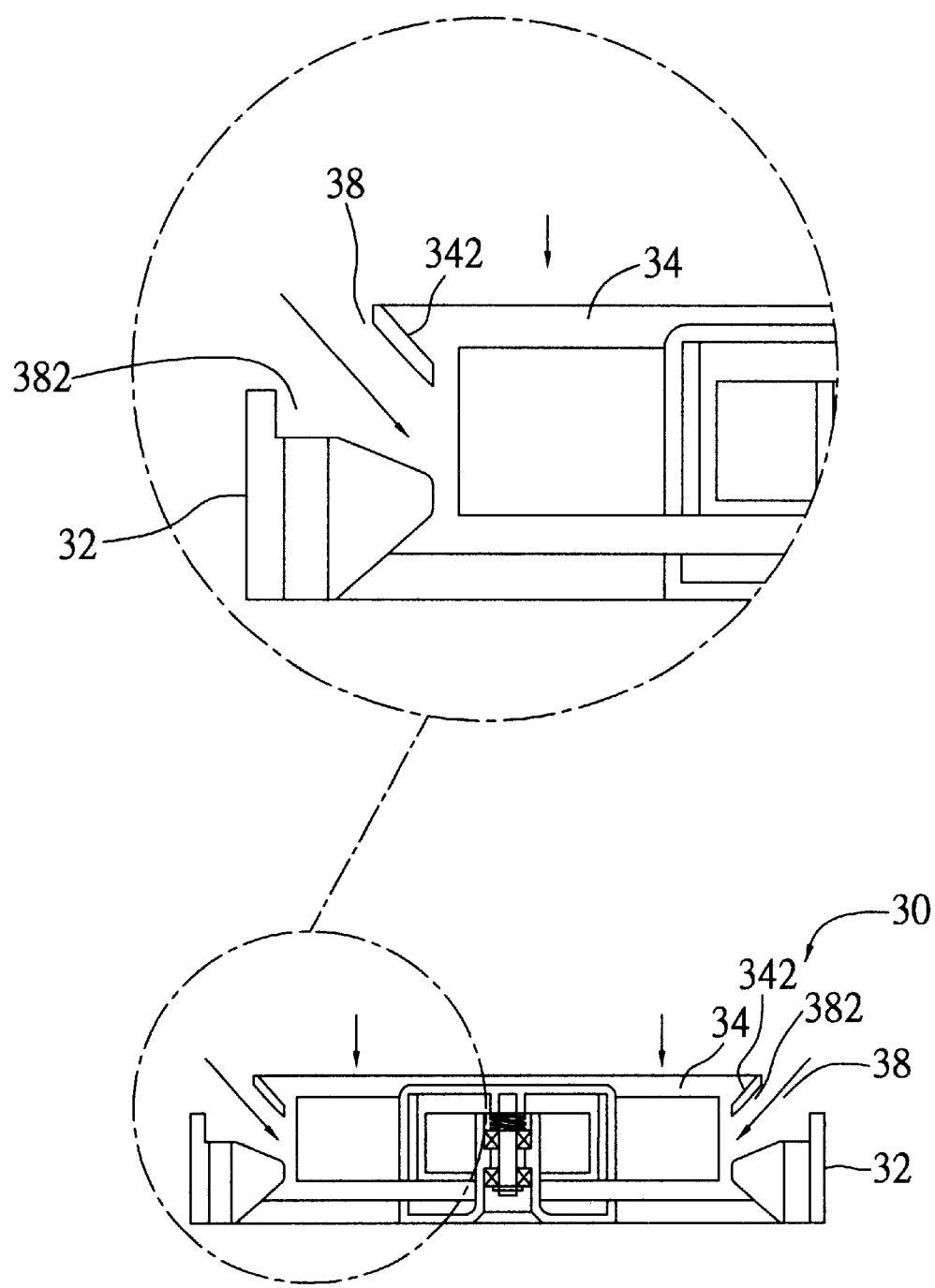
FIG. 4C is a cross-sectional view and a partial enlarged view of the fan shown in FIG. 4A taken along line C—C.

FIGS. 4A–4C illustrate a fan 30 with a fan frame 32 according to a second preferred embodiment of the invention. The second embodiment is structurally similar to the above first embodiment, except that in the fan 30 with the fan frame 32, as shown in FIGS. 4A–4C, a recessed portion 38 is recessed from each edge corner of the fan frame 32 in a direction substantially along an upper inwardly-tapered conical surface 342 of a centrally-situated opening 34 of the fan frame 32, and integrally formed with an auxiliary inlet 382 for connecting the recessed portion 38 to the opening 34. Such a recessed portion 38 with the auxiliary inlet 382 can desirably accommodate more air to enter into the fan 30, as compared to the previous first embodiment; thereby, the fan frame 32 of this embodiment further facilitates air intake and wind output as well as improves heat dissipation efficiency for the fan 30.

Third Preferred Embodiment

Figure 5A:
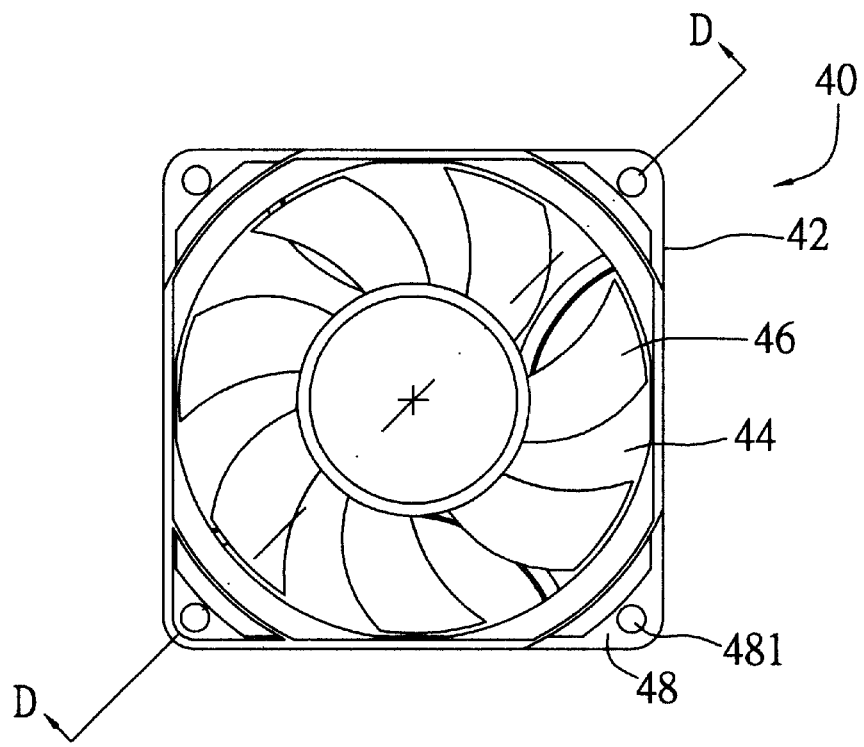
FIG. 5A is a top view of a fan with a fan frame according to a third preferred embodiment of the invention.
Figure 5B:
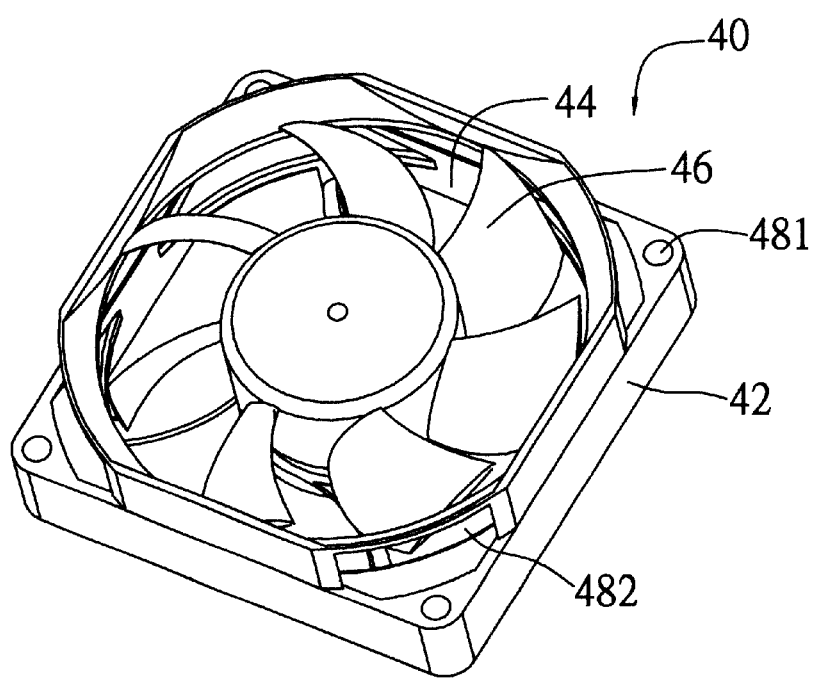
FIG. 5B is a perspective view of the fan shown in FIG. 5A.
Figure 5C:
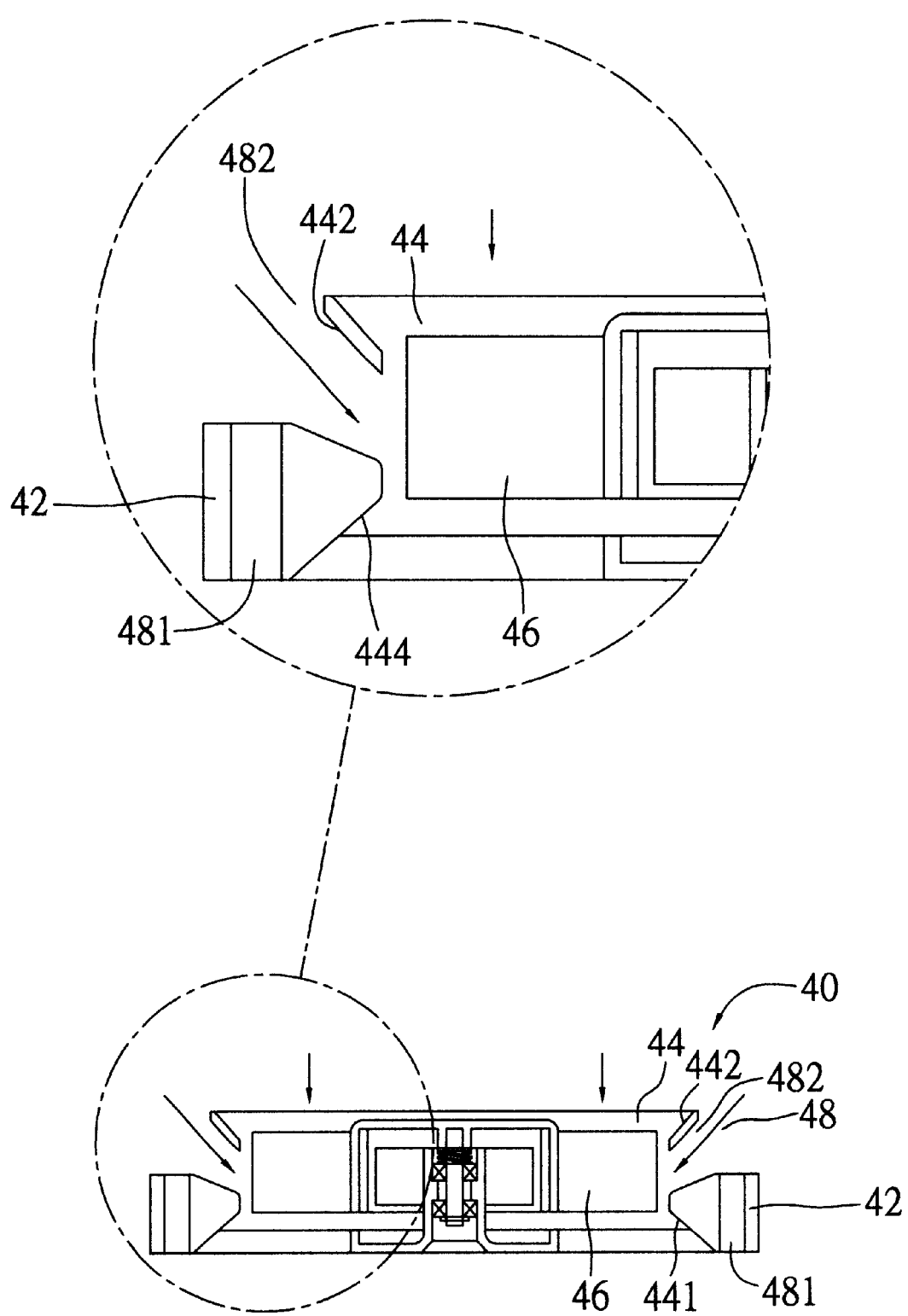
FIG. 5C is a cross-sectional view and a partial enlarged view of the fan shown in FIG. 5A taken along line D—D.

FIGS. 5A–5C illustrate a fan 40 with a fan frame 42 according to a third preferred embodiment of the invention. The third embodiment is structurally similar to the above second embodiment, except that in the fan 40 with the fan frame 42, as shown in FIGS. 5A–5C, a recessed portion 48 recessed from each edge corner of the fan frame 42, is adapted to allow a screw hole 481 formed at the bottom of the recessed portion 48 to be completely exposed to outside of the fan frame 42; with provision of an auxiliary inlet 482 for connecting the recessed portion 48 to a centrally-situated opening 44 of the fan frame 42, even more air is allowed to enter into the fan 40 through the use of the fan frame 42 in favor of air intake and wind output for the fan 40, as compared to the previous second embodiment.

Fourth Preferred Embodiment

Figure 6A:
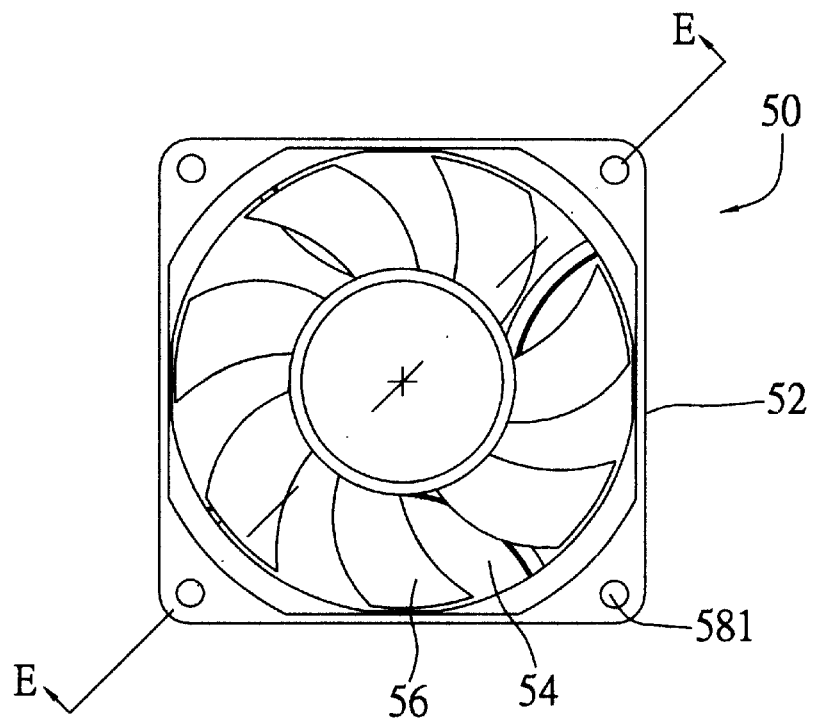
FIG. 6A is a top view of a fan with a fan frame according to a fourth preferred embodiment of the invention.
Figure 6B:
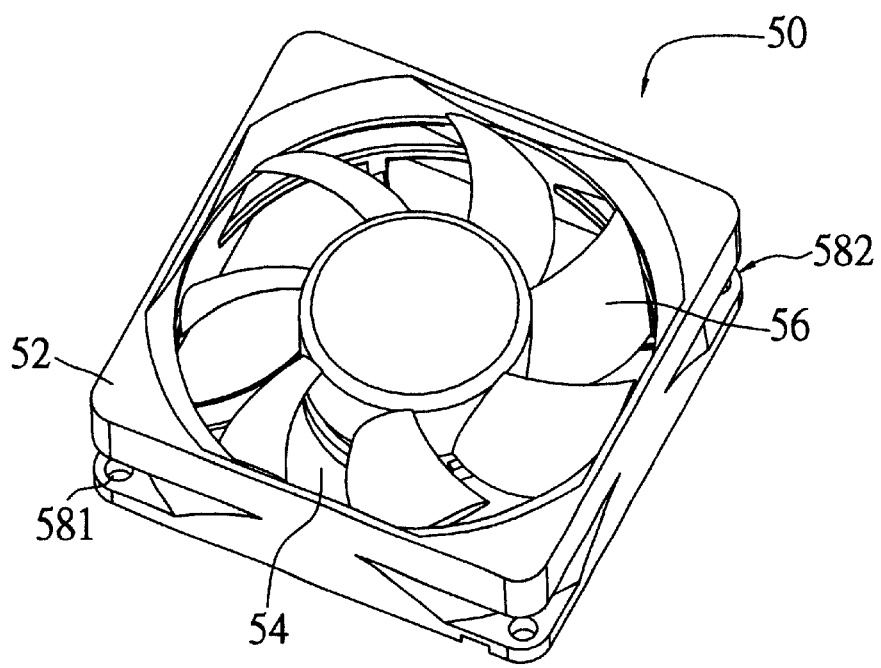
FIG. 6B is a perspective view of the fan shown in FIG. 6A.
Figure 6C:
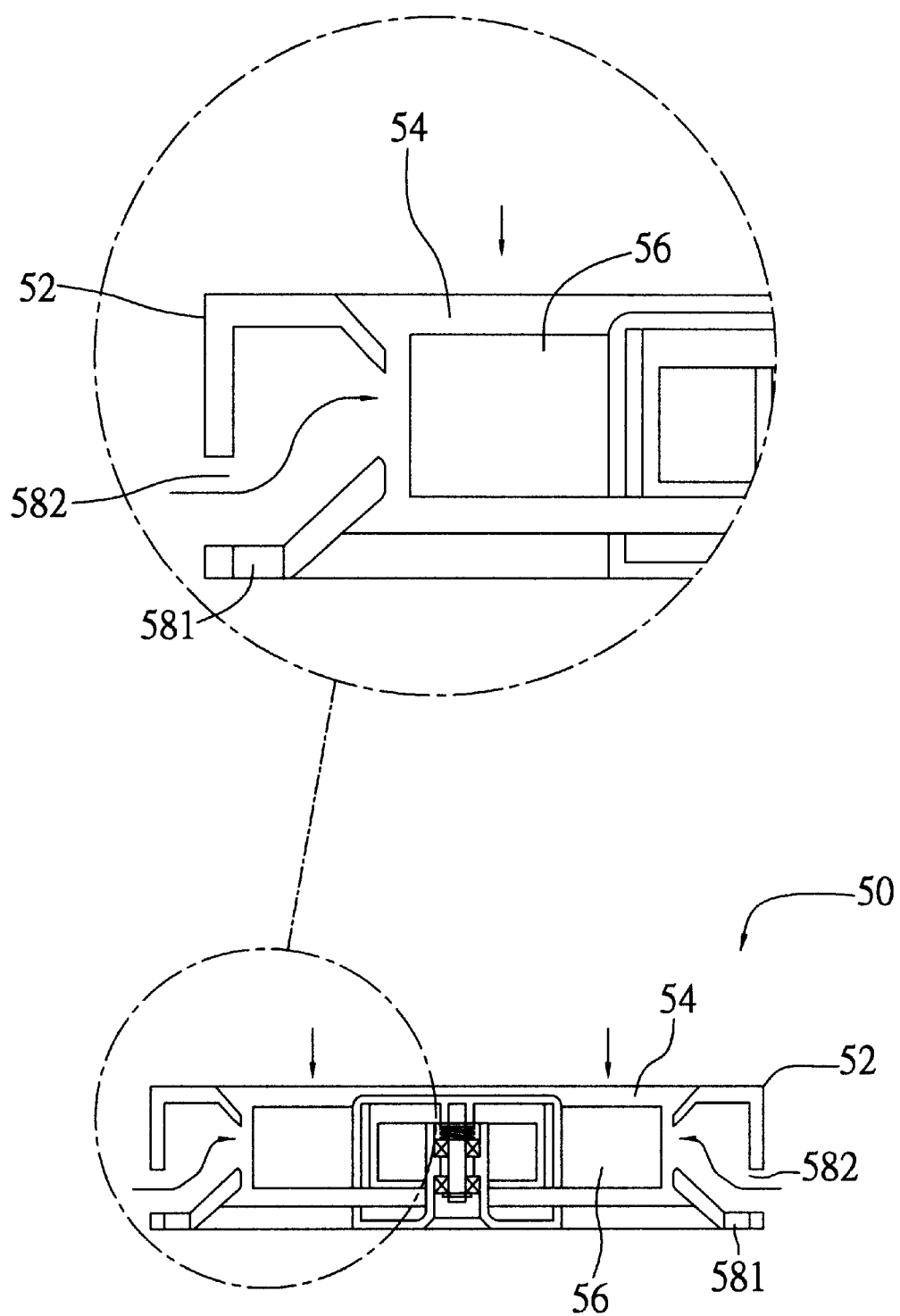
FIG. 6C is a cross-sectional view and a partial enlarged view of the fan shown in FIG. 6A taken along line E—E.

FIGS. 6A–6C illustrate a fan 50 with a fan frame 52 according to a fourth preferred embodiment of the invention.

As shown in FIGS. 6A–6C, the fan frame 52 may be shaped as a square with a centrally-situated opening 54 for receiving a plurality of blades 56 therein. Four corners of the fan frame 52 are each formed with a hollow portion, wherein at least a screw hole 581 is disposed at a bottom wall of the fan frame 52 encompassing the hollow portion, allowing a screw to be inserted into the screw hole 581 for fixing the fan 50 in position. An auxiliary inlet 582 is formed through a side wall of the fan frame 52 encompassing the hollow portion and connected to the opening 54 for allowing air to enter through the auxiliary inlet 582 and corresponding hollow portion into the opening 54.

Therefore, total air intake area of the fan 50 includes cross-sectional area of the opening 54 and auxiliary inlets 582, thereby increasing air intake and wind output as well as improving heat dissipation efficiency for the fan 50 through the use of the fan frame 52

It should be understood that, the hollow portions are not limited to be situated at corners of the fan frame 52, but can be formed at other peripheral positions outside the opening 54.

Fifth Preferred Embodiment

Figure 7A:
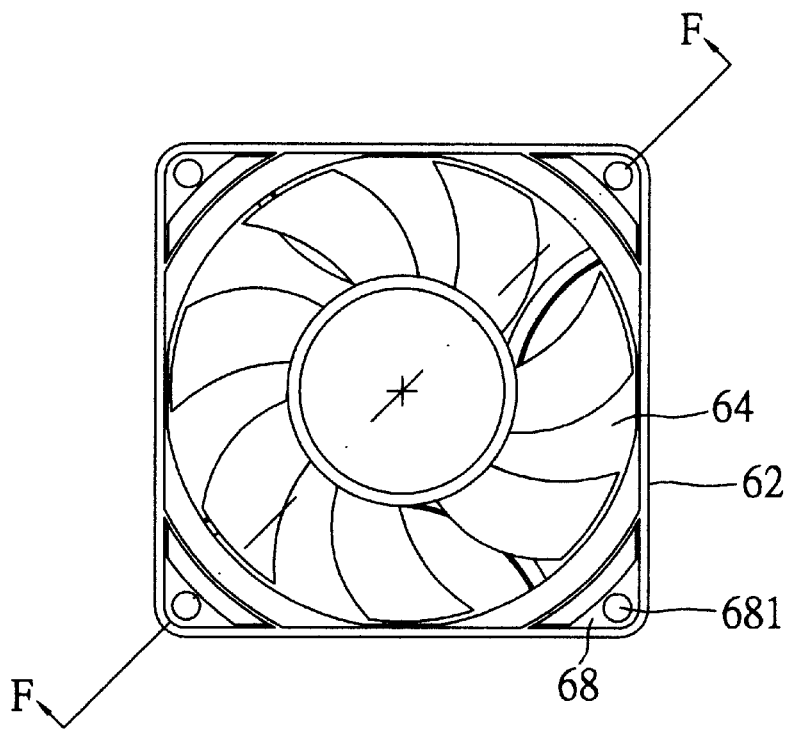
FIG. 7A is a top view of a fan with a fan frame according to a fifth preferred embodiment of the invention.
Figure 7B:
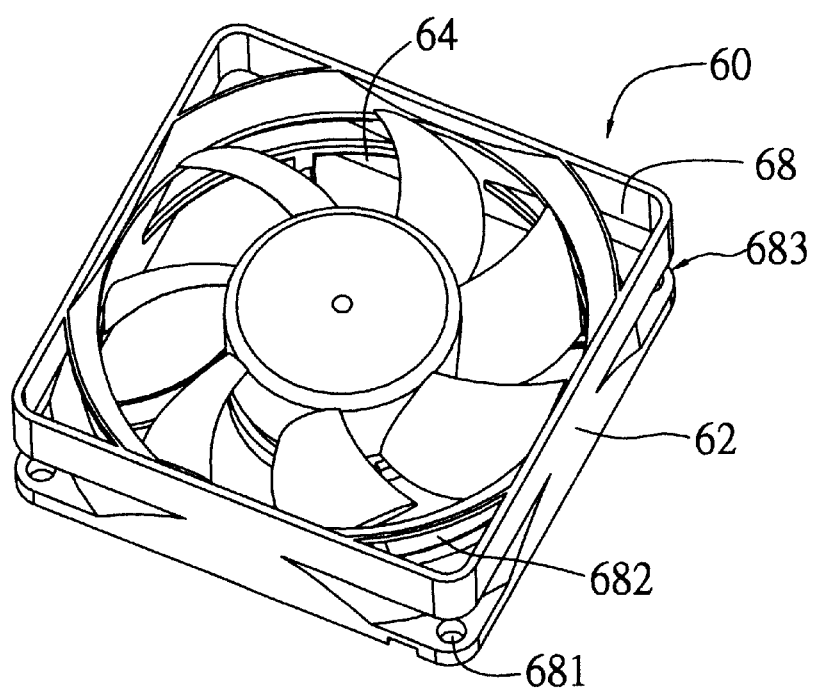
FIG. 7B is a perspective view of the fan shown in FIG. 7A.
Figure 7C:
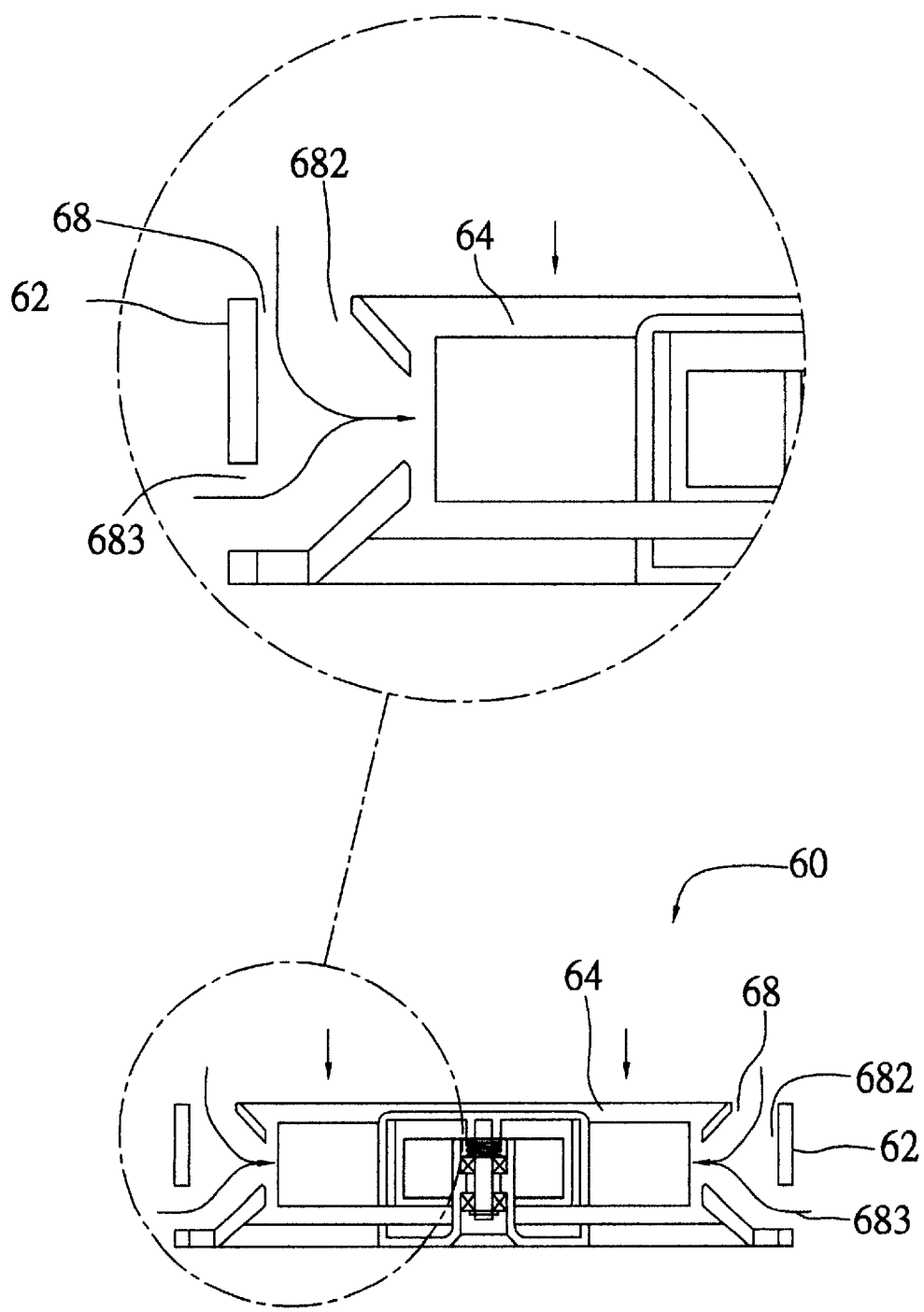
FIG. 7C is a cross-sectional view and a partial enlarged view of the fan shown in FIG. 7A taken along line F—F.

FIGS. 7A–7C illustrate a fan 60 with a fan frame 62 according to a fifth preferred embodiment of the invention. The fifth embodiment is a combination of the above first and fourth embodiments; as shown in FIGS. 7A–7C, in the fan 60 with the fan frame 62, a corner-situated recessed portion 68 that is recessed from a top side of the fan frame 62 and connected with a first auxiliary inlet 682, is combined with a second auxiliary inlet 683 formed through a side wall of the fan frame 62 encompassing a corner-situated hollow portion in the fan frame 62, wherein the first auxiliary inlet 682 and the hollow portion are connected to a centrally-situated opening 64 of the fan frame 62. This allows air to enter from the top side of the fan frame 62 through the opening 64 and through the recessed portion 68 and first auxiliary inlet 682 into the opening 64, as well as to enter via the second auxiliary inlet 683 and hollow portion into the opening 64. Thereby, the fan 60 with the fan frame 62 can operate more efficiently with increased air intake and wind output, so as to effectively dissipate heat generated from an electronic device (not shown) mounted with the fan 60.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A fan frame for use with a fan, the fan frame comprising:
   a frame body having a top side and a bottom side opposed to the top side;
   an opening formed through the top and bottom sides of the frame body, allowing a plurality of blades of the fan to be received in the opening; and
   at least a recessed portion formed at a corner of the frame body at a position outside the opening and connected to the opening;
   wherein by rotation of the blades of the fan, air is adapted to enter via the top side of the frame body into the opening directly and also through the recessed potion into the opening, so as to facilitate the air intake for the fan.

2. The fan frame of claim 1, wherein the recessed portion is recessed from the top side of the frame body.

3. The fan frame of claim 1, wherein the recessed portion is recessed from a peripheral side vertically interposed between the top and bottom sides of the frame body.

4. The fan frame of claim 1, wherein the recessed portion is recessed at intersection between the top side and a peripheral side vertically interposed between the top and bottom sides of the frame body.

5. The fan frame of claim 1, wherein a plurality of screw holes are formed at the bottom side of the frame body to be connected to the recessed portion, allowing screws to be inserted into the screw holes for fixing the fan frame in position.

6. The fan frame of claim 1, wherein the opening is inwardly tapered at positions corresponding to the top and bottom sides of the frame body.

7. The fan frame of claim 6, wherein the recessed portion is arranged substantially in gradient corresponding to tapering of the opening.

8. A fan frame for use with a fan, the fan frame comprising:
   a frame body having a top side and a bottom side opposed to the top side;
   an opening formed through the top and bottom sides of the frame body, allowing a plurality of blades of the fan to be received in the opening; and
   at least a hollow portion peripherally formed in the frame body at a position outside the opening and connected to the opening, wherein at least a hole is formed to connect the hollow portion to outside of the fan frame;
   wherein by rotation of the blades of the fan, air is adapted to enter via the top side of the frame body into the opening directly and also through the hole of the hollow portion into the opening, so as to facilitate air intake for the fan.

9. The fan frame of claim 8, wherein the hole is formed through the top side of the frame body corresponding in position to the hollow portion.

10. The fan frame of claim 8, wherein the hole is formed through a peripheral side vertically interposed between the top and bottom sides of the frame body corresponding in position to the hollow portion.

11. The fan frame of claim 8, wherein two holes are formed respectively through the top side and through a peripheral side vertically interposed between the top and bottom sides of the frame body corresponding in position to the hollow portion.

12. The fan frame of claim 8, wherein the opening is inwardly tapered at positions corresponding to the top and bottom sides of the frame body.

13. The fan frame of claim 8, wherein a plurality of screw holes are formed at the bottom side of the frame body to be connected to the hollow portion, allowing screws to be inserted into the screw holes for fixing the fan frame in position.

14. A fan frame for use with a fan, the fan frame comprising:
   a frame body having a top side and a bottom side opposed to the top side;
   an opening formed through the top and bottom sides of the frame body, allowing a plurality of blades of the fan to be received in the opening;
   at least a recessed portion formed on the frame body at a position outside the opening and connected to the opening; and
   a plurality of screw holes formed at the bottom side of the frame body and connected to the recessed portion, allowing screws to be inserted into the screw holes for fixing the fan frame in position;
   wherein by rotation of the blades of the fan, air is adapted to enter via the top side of the frame body into the opening directly and also through the recessed portion into the opening, so as to facilitate the air intake for the fan.

15. The fan frame of claim 14, wherein the recessed portion is recessed from top side of the frame body.

16. The fan frame of claim 14, wherein the recessed portion is recessed from a peripheral side vertically interposed between the top and bottom sides of the frame body.

17. The fan frame of claim 14, wherein the recessed portion is recessed at intersection between the top side and a peripheral side vertically interposed between the top and bottom sides of the frame body.

18. The fan frame of claim 14, wherein the opening is inwardly tapered at positions corresponding to the top and bottom sides of the frame body.

19. The fan frame of claim 18, wherein the recessed portion is arranged substantially in gradient corresponding to tapering of the opening.

* * * * *